United States Patent
Hunter et al.

(10) Patent No.: US 7,336,533 B2
(45) Date of Patent: Feb. 26, 2008

(54) ELECTRONIC DEVICE AND METHOD FOR OPERATING A MEMORY CIRCUIT

(75) Inventors: Bradford L. Hunter, Austin, TX (US); James D. Burnett, Austin, TX (US); Jack M. Higman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 11/337,775

(22) Filed: Jan. 23, 2006

(65) Prior Publication Data

US 2007/0171713 A1 Jul. 26, 2007

(51) Int. Cl.
*G11C 11/34* (2006.01)
(52) U.S. Cl. .................. 365/185.07; 365/154; 365/156
(58) Field of Classification Search ........... 365/185.07, 365/154, 190, 181, 161, 156, 63
See application file for complete search history.

(56) References Cited

U.S. PATENT DOCUMENTS

| | | | |
|---|---|---|---|
| 5,706,226 A | | 1/1998 | Chan |
| 5,748,643 A | * | 5/1998 | Pelella et al. ............... 714/726 |
| 5,831,897 A | * | 11/1998 | Hodges ...................... 365/156 |
| 6,091,626 A | * | 7/2000 | Madan ........................ 365/154 |
| 6,466,504 B1 | * | 10/2002 | Roy ............................ 365/218 |
| 6,804,143 B1 | | 10/2004 | Hobson |
| 2006/0239057 A1 | * | 10/2006 | Muller et al. ................. 365/63 |
| 2006/0274569 A1 | * | 12/2006 | Joshi et al. ................... 365/154 |

FOREIGN PATENT DOCUMENTS

| | | |
|---|---|---|
| JP | H10-027476 A | 1/1998 |
| JP | 2001-143473 A | 5/2001 |

OTHER PUBLICATIONS

U.S. Appl. No. 11/123,514, entitled "Dual-Port Static Random Access Memory Having Improved Cell Stability and Write Margin," filed May 6, 2005.

\* cited by examiner

*Primary Examiner*—Van Thu Nguyen
*Assistant Examiner*—Dang Nguyen

(57) ABSTRACT

An electronic device includes a memory cell that utilizes a bi-directional low impedance, low voltage drop full pass gate to connect a bit cell to a bit write line during a write phase, and during a read phase the full pass gate can remain off and a high input impedance read port can acquire and transmit the logic state stored by the memory cell to another subsystem. The full pass gate can be implemented by connecting a P type metal semiconductor field effect transistor (PMOS) in parallel with an NMOS device and driving the gates of the transistors with a differential signal. When a write operation requires a current to flow in a first direction, the PMOS device provides a negligible voltage drop, and when the write operation requires current to flow in a second or the opposite direction, the NMOS device can provide a negligible voltage. This bi-directional low voltage drop low loss switch can increase the write margin of the memory cell wherein the high impedance read port can provide increased isolation for the stored value during the read phase increasing the performance of the memory cell.

17 Claims, 4 Drawing Sheets

US 7,336,533 B2

ELECTRONIC DEVICE AND METHOD FOR OPERATING A MEMORY CIRCUIT

FIELD OF THE DISCLOSURE

The present disclosure relates generally to electronic devices and more specifically to an electronic device having memories and a method for controlling.

BACKGROUND

In an effort to reduce the size of mobile electronic devices and increase the battery life of such devices, an emphasis has been placed on implementing low voltage circuit designs. However, designers of low voltage circuits face many challenges. One such challenge includes the design of reliable low voltage memory circuits. In particular, current static random access memory (SRAM) cell designs can suffer serious performance degradation at lower supply voltages. Operating parameters, such as signal to noise margin (SNM) during the read phase, write margin (WM) during the write phase, and cell current (Icell) during both the read and the write phase should be maintained within certain limits to ensure robust memory system operation. These parameters typically degrade below acceptable levels when the supply voltage for the cell is lowered to meet new design standards. Accordingly, there is a need for a device and method that provides improved operational parameters for SRAM memory cells at low voltages.

BRIEF DESCRIPTION OF THE DRAWINGS

The present disclosure may be better understood, and its numerous features and advantages made apparent to those skilled in the art, by referencing the accompanying drawings in which like reference numbers indicate similar or identical items.

DETAILED DESCRIPTION

Electronic devices in accordance with the present disclosure utilize a device with static random access memory (SRAM) having full pass gates as switches to facilitate the transfer of signals, i.e. information, between data transmission lines, i.e., bit lines, and memory cells. When a full pass gate is activated, i.e., turned on, during a write phase, the write information on the bit line can be written to, i.e., transferred to, the bit cell over a low impedance connection regardless of a logic state of the signal being transferred to facilitate low voltage write operation, i.e., less than 1.0 volts. Instead of using the full pass gates to read stored information, a separate high impedance read path is utilized, as reading signals through low impedance full pass gates can result in destructive read conditions at low voltages.

The systems and methods described herein can provide an improved signal to noise margin (SNM) and cell current during the read phase and an improved cell current and write margin during the write phase. In accordance with an embodiment of the present disclosure, a bi-directional, low impedance, low voltage drop, full pass gate can be utilized to connect a bit cell to a bit write line during a write phase, and during a read phase the full pass gate can remain off and a high input impedance read port can retrieve and transmit the logic state of the bit cell to another subsystem. Thus, a bit cell can be provided with a high degree of isolation at all times except during a write phase when minimal isolation is desired. The full pass gate can be implemented by connecting a P-type transistor, such as a metal oxide semiconductor field effect transistor (PMOS), in parallel with an N-type transistor, i.e. an NMOS transistor, and driving the gates of these transistors with complementary signals. When a write operation, i.e. a write phase, requires a current to flow in a first direction, the PMOS device provides a negligible voltage drop in the first direction increasing the write margin of the cell. When a write operation requires current to flow in a second direction, the opposite direction from the first direction, the NMOS device can provide a negligible voltage drop in the second direction thereby increasing the write margin. This is different from conventional memory cells that use single transistor pass gates, in that regardless of whether the signal at a storage node is being driven high or pulled low, a very small voltage drop and low impedance can be provided by the full pass gate to facilitate current flow. In addition, a high impedance is maintained between the bit cell and the bit lines during all other phases of operation.

Figure 1:
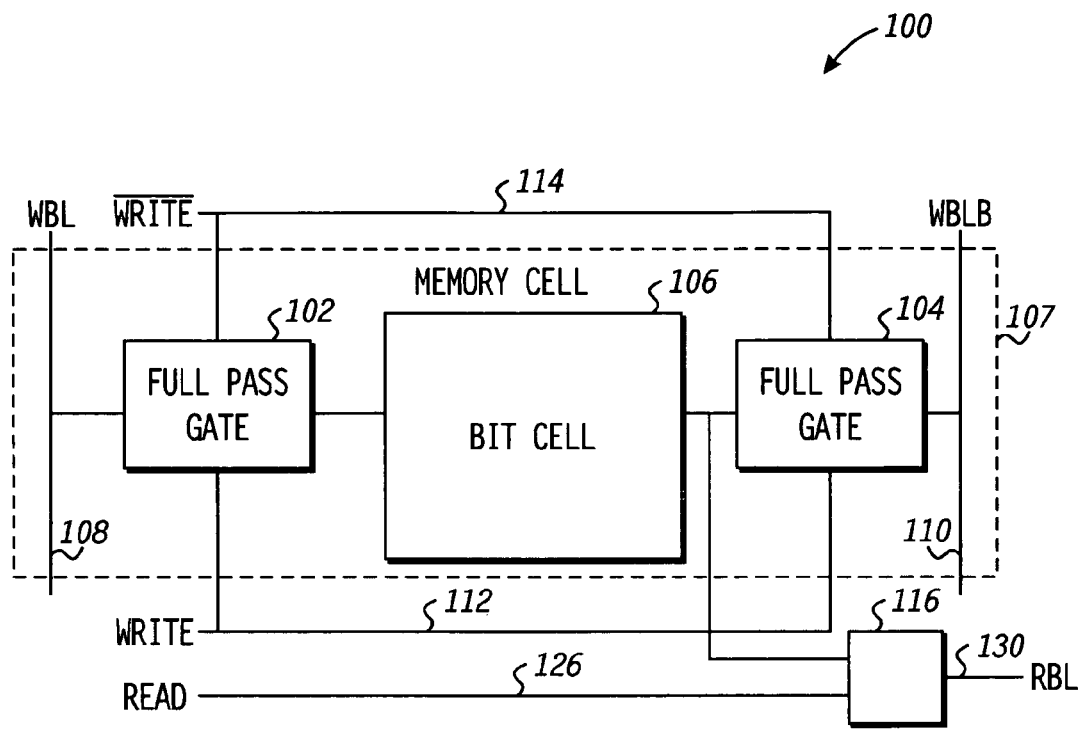
FIG. 1 is a block diagram of a memory cell configuration in accordance with a specific embodiment of the present disclosure.

Referring to FIG. 1, an exemplary block diagram of a memory sub-system 100 is illustrated. In accordance with the illustrated embodiment, a bit cell 106 is connected to write bit line (WBL) 108 via full pass gate (FPG) 102 and connected to write bit line bar (WBLB) 110 via full pass gate (FPG) 104. These components can be compactly configured into a memory cell 107. In operation, during a write phase two control lines, write control line (WRITE) 112 and a complementary write control line (WRITEB) 114, can provide control signals to FPG 102 and FPG 104. When FPGs 102 and 104 are turned on by control signals during a write phase, logic levels or signal on the bit lines 108 and 110 can be transferred to the bit cell 106. FPGs 102 and 104 can each provide a very low voltage drop such as voltage drops that are less than one-half a voltage threshold of a transistor, which would include a voltage drop of substantially zero volts, e.g., voltage drops in the micro-volt range, such that the full pass gate provides a low impedance, low loss, low voltage drop, bidirectional switch between the memory cell and the bit line. As used herein, the term "full pass gate" is defined to mean a bidirectional data switch having two or more transistor. One example of a full pass gate includes a transmission gate having an n-channel transistor and a p-channel transistor with separate gate connections and common source and drain connections.

During a read phase, the logic value stored by the bit cell 106 can be retrieved from the bit cell 106 through read port 116 and provided via read bit line (RBL) 130 to other subsystems (not shown). Read port 116 can provide a high impedance to current flow to and from the bit cell 106 at all times. This high impedance connection allows only negligible currents to flow between the read bit line 130 and the bit cell 106, thereby facilitating an improved noise margin and improved cell stability as compared to traditional memory cell configurations during the read phase. Thus, in accordance with one embodiment of the present disclosure, FPGs 102 and 104 remain off during the read phase, and a read bit line that is separate from the write-bit lines is used to activate the read port 116 such that the read port 116 can acquire the value stored by the bit cell 106.

In a particular embodiment, the read control line (READ) 126 and write control lines 112 and 114 are physically separate conductors to minimize the coupling between read and write subsystems during memory system operation, such that improved read and write control can be provided by the system and method disclosed herein. Thus, a write control signal and a complementary write control signal can be asserted during a write phase and negated during a read phase, and the read control signal can be asserted during the read phase and negated during the write phase. Although read port 116 is illustrated as connected to only one node of the bit cell 106, a differential read port connected to both nodes of bit cell 106 to read a differential signal could be used without parting from the scope of the present disclosure.

It can be appreciated that during a write cycle it is advantageous not to impede the transfer of signals (i.e., it is advantageous to provide a low impedance) between a bit cell and its write bit line yet during a read cycle it is advantageous to provide the proper amount of impedance between the bit cell and its read bit line such that the value of the bit cell can be read without changing the state of the bit cell. Traditional SRAM designs utilize a pass gate that provides impedance during both the read phase and the write phase thereby compromising performance during both phases. The teachings herein provide an advantage over typical SRAM configurations in that a first set of operational parameters can be provided between a bit cell and bit lines during the read phase and a second set of operational parameters can be provided during the write phase.

Figure 2:
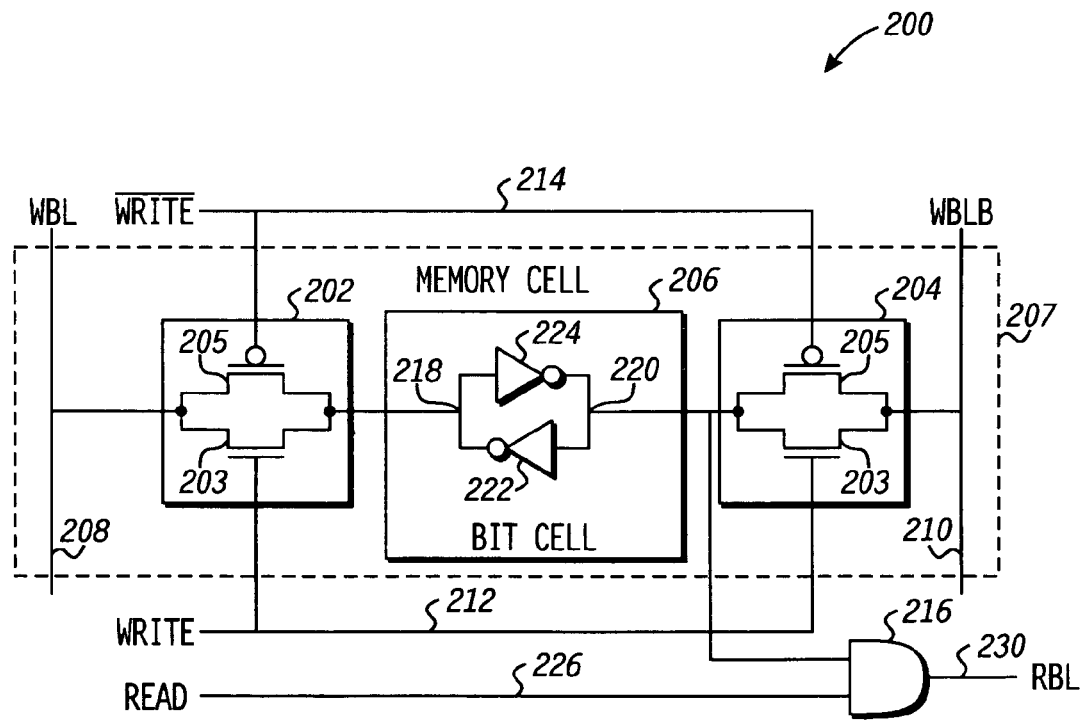
FIG. 2 is a block diagram of a more detailed memory cell configuration in accordance with another embodiment of the present disclosure.

Referring to FIG. 2, an exemplary block diagram of a memory sub-system 200 is illustrated. In FIGS. 1 and 2 components performing like functions are called out utilizing the same numbered series. For example, bit cell is assigned callout 106 in FIG. 1, while in FIG. 2 bit cell is assigned callout 206.

In accordance with the illustrated embodiment, a bit cell 206 is connected to complementary write bit lines. Specifically, bit cell 206 is connected to a first write bit line (WBL) 208 via a full pass gate (FPG) 202 and connected to a second, complementary, write bit line (WBLB) 210 via FPG 204. These components can be located in a layout of a memory cell 207. In a particular embodiment, WBL 208 and WBLB 210 are discrete conductors that can provide a logic signal to the full pass gates of bit cell 206 when FPGs 202 and 204 are turned on.

FPG 202 can have a first transistor 203, and a second transistor 205 to provide a low loss bidirectional full pass gate. One of the transistors of FPG 202 can provide a low voltage drop while conducting current in a first direction and one transistor can provide a low voltage drop when current is conducted in a second direction (opposite of the first direction). In order to turn on both transistors simultaneously, two asserted signals with opposite polarities can be provided to the FPG 202 via write control line 212 and complementary write control line 214, respectively. Utilizing this dual transistor configuration in both FPG 202 and FPG 204, a low voltage logic data signal present on write bit lines 208 and 210 can be efficiently transferred to storage nodes of the bit cell 206 during the write phase. In a particular embodiment, the signals on write control line (WRITE) 212 and complementary write control line (WRITEB) 214 are only asserted during the write phase.

First transistor 203 can be a N-type field effect transistor, such as a metal oxide semiconductor (PMOS) device. Second semiconductor device 205 can be a P-type field effect transistor, such as a NMOS device. The PMOS device connected in parallel with the NMOS device can perform as a low loss, low voltage drop switch referred to herein as a full pass gate. The NMOS device and the PMOS device can be manufactured such that their forward voltage drops (in opposite directions) are less than one-half of their voltage thresholds. In a particular application the voltage drop of the pass gates for current flowing in either direction is less than 250 millivolts and typically is substantially zero. This low voltage drop allows a low voltage data logic signal representing a logic level (high or low) on the bit lines 212 and 214 to drive the inverters 222 and 224 of the bit cell 206.

During a write phase it is beneficial for the full pass gates to provide a low impedance path when turned on to facilitate a high write margin. Traditional pass gate designs are controlled similarly during both a read phase and a write phase, and, therefore, the same pass gate impedance is present during the read and write phase. Thus, historically, write margin of a memory cell could not be improved without degrading the static noise margin, and, likewise, the static noise margin could not be improved without degrading the write noise margin. The full pass gate described herein can provide improved write margin during a write phase due to its low impedance and because the pass gate is off during a read phase the memory system can maximize the static noise margin. Essentially, the inclusion of a separate read port can reduce static noise margin as a design concern for memory systems. If a full pass gate were to be utilized in a conventional memory cell configuration, the system would most likely not be able to perform a read operation as the stored data would probably be erased during such a process, thereby resulting in an unacceptable static noise margin.

In a specific embodiment, the drain electrode of the NMOS device is connected to the source electrode of a PMOS device and the source electrode of the NMOS device is connected to the drain of the PMOS device. The NMOS device can have a first electrode connected to the first node of the bit cell 206, a second electrode connected to the WBLA 208, and a control electrode connected to the write control line 212. The PMOS device can have a first electrode connected to the first node of the bit cell 206, a second electrode connected to WBL 208, and a control electrode connected to the complementary write control line 214. Essentially, the current electrodes of each FPG transistor 203 can be connected in parallel with the current electrodes of each FPG transistor 205, and the control electrodes of transistors 203 and 205 can be connected to complementary control lines 212 and 214.

Bit cell 206 can be implemented to function generally as two cross-coupled inverters. Specifically, an inverter 222 can have its output connected to the input of inverter 224 and its input connected to the output of inverter 224, wherein a signal provided to the input of one of the inverters can "flip"

the state of both inverters and set or reset the logic value stored by the cell. In this configuration, when storage node 218 is asserted, storage node 220 is negated.

At low supply voltages, a bidirectional forward voltage drop for traditional pass gates of say than one-half a voltage threshold of a transistor volts can impede the signal on the bit line, preventing the signal from being large enough to "toggle" the bit cell 206 during a write operation. FPGs 202 and 204, using a cross-coupled transistor configuration, or the like, can provide a negligible voltage drop, e.g., substantially zero, when turned on, allowing a signal on the bit line to easily toggle the bit cell 206, thereby decreasing the write margin of the memory cell 207.

However, at low voltages, cross-coupled inverters such as FPGs 202 and 204 tend to be unstable. The implementation of a full pass gate contributes to this instability by reducing the electrical isolation between the storage nodes 218 and 220 of bit cell 206 and the write bit line(s). This minimal isolation is traditionally a problem when the pass gates are turned on during a read phase, because when one inverter has a lower threshold voltage than the other inverter, which is typically the case, due to manufacturing variations, and when switching noise or an unintended voltage is placed on either or both storage nodes of the bit cell 206, the value stored at bit cell 206 can flip to an unknown state causing failure.

In accordance with a particular embodiment of the present disclosure, a high impedance connection can be provided by all circuits connected to the bit cell 106 during the read phase, thus providing superior isolation and static noise margin for the bit cell 206. A read port 210 under the control of a read control signal provided via discrete read control line 226 can be configured to determine the value stored by the bit cell 206 at storage node 220. The read port 216 can acquire such a value without requiring a significant current flow to or from the storage node 220. The read port 216 can have an input for determining the value of the stored bit and provide a logic signal on the read bit line 230 responsive to the acquired value during the read phase.

Read port 216 can function conceptually as a tri-state AND gate or a tri-state NAND gate. The read port 216 can have a high input impedance such that at all times and particularly during the read phase, the value stored by the bit cell 206 can remain undisturbed. The high impedance provided at the input of the read port 216 prevents significant current from flowing to and from the bit cell 106, thereby minimizing signal-to-noise margin problems associated with the memory cell. Note that the AND gate of FIG. 2 would typically have its output tri-stated when not being read to facilitate other memory cells driving of the read bit line.

Figure 3:
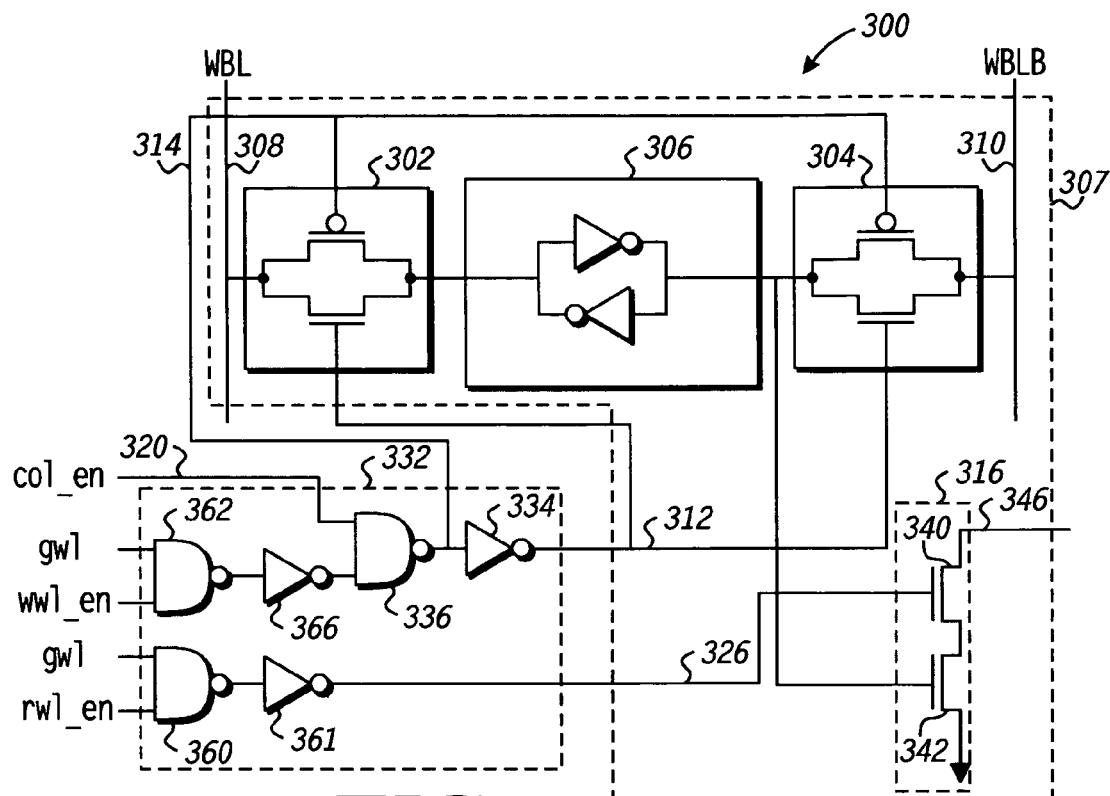
FIG. 3 is a block diagram of an exemplary memory cell configuration that includes logic used to control portions of the bit cell.

Referring to FIG. 3, a particular embodiment of a memory system 300 is illustrated in block diagram format. The memory system 300 generally, includes a memory cell 307 and supporting control logic 332. In FIGS. 2 and 3, components performing like functions are called out utilizing the same series of numbers. For example, bit cell is assigned callout 206 in FIG. 2 while in FIG. 3, bit cell is assigned callout 306.

In accordance with the illustrated embodiment, a bit cell 306 is connected to a first write bit line (WBL) 308 via a full pass gate (FPG) 302 and connected to a second complementary write bit line (WBLB) 310 via full pass gate (FPG) 304. The particular embodiment illustrated utilizes discrete conductors for providing read and write control signals as well as for the illustrated read bit line and write bit lines. Hence, a write control line (WCL) 312 and a complementary write control line (WCLB) 314 can be asserted during a write phase and negated during a read phase. The WCLB 314 and the WCL 312 can control FPG 302 and FPG 304 as explained above with respect to FIG. 2.

Additionally, a read port 316 can be included as part of the layout of memory cell 307. The read port 316 can detect a signal stored by the bit cell 306 and provide a corresponding signal on the read bit line 346 during a read phase. The read port 316 can be configured with pull down transistors 340 and 342. A single storage node of the bit cell 306 can be connected to and drive one of the pull down transistors 340 and 342. Thus, when a read signal on read control line 326 is at a logic high and the bit cell 306 is storing a logic high, both transistors 340 and 342 will be turned on, pulling read line 346 to a low voltage to provide a signal indicative of the stored value. An inverter (not shown) can invert the signal on the read line 346 to provide a signal that is a replica of the signal stored at the bit cell 306 during the read phase. Note that a logic low stored at bit cell 306 would result in the output of port 316 being tri-stated during read phase. A current sensor (not shown) or pull-up transistor connected to the RBL 346 (not shown) can be used to facilitate reading of a low logic level stored at the bit cell.

Pull down transistors 340 and 342 can be metal oxide semi-conducting field effect transistors (MOSFET). These MOSFETs can have a resistive input gate impedance of several mega ohms such that only a few micro-amps of current ever flow to and from the storage node of the bit cell 106 during a read phase.

During a write phase, NAND gate 336 can accept a column enable signal (col-en) via column enable line 320, a write enable signal (wwl-en) via write enable NAND gate 362 and inverter 366. During the write phase the write control line 312 will transition to a high signal via inverter 334, and the complementary write control line 314 will transition to a low signal. FPG 302 and FPG 304 can utilize both of these signals to turn on during a write phase. During a read phase, NAND gate 360 can accept a read enable signal (rwl_en) to transition the read control line 326. Note that gates 362 and 360 also receive a signal labeled gwl, which stands for global word line enable. The signal gwl can select a bank of wordline drivers to be further enabled by wwl-en previously described.

Figure 4:
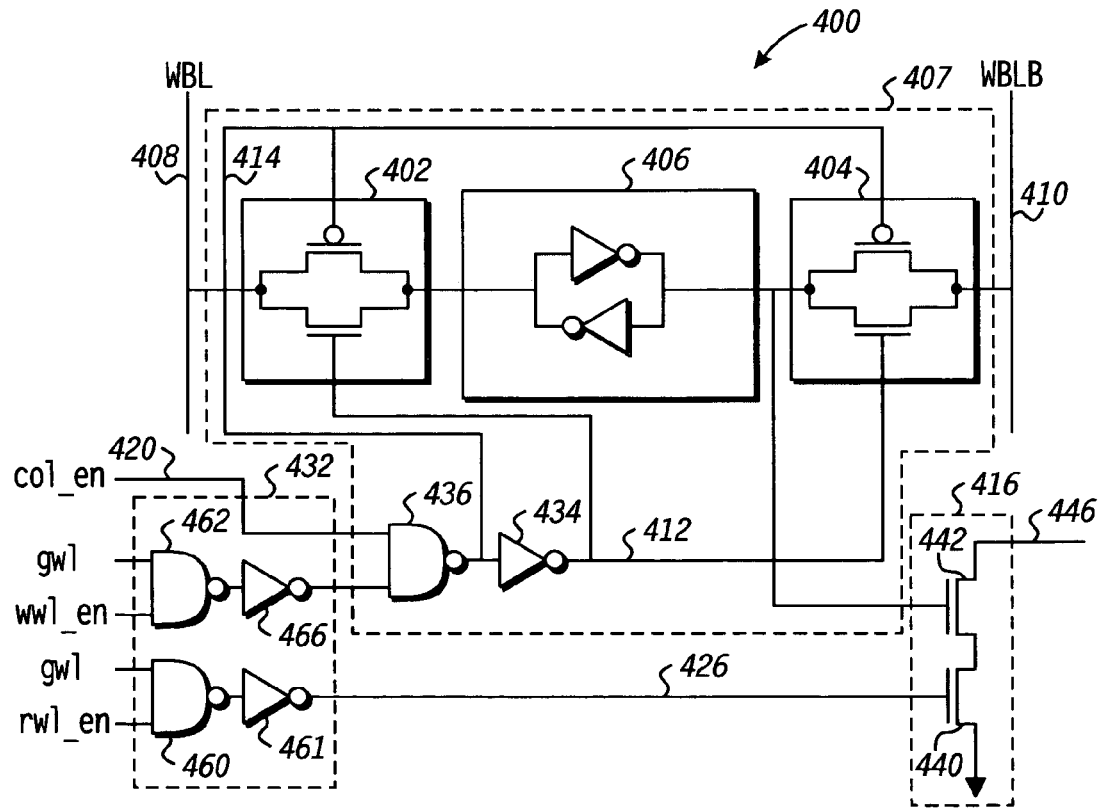
FIG. 4 is a block diagram of another exemplary memory cell configuration having write line control logic within the memory cell in accordance with another embodiment of the present disclosure.

Referring to FIG. 4, another possible embodiment of a memory system 400 is illustrated in block diagram format. The memory system 400 generally includes a memory cell 406, supporting control logic 432, and read port 416. In FIGS. 3 and 4, components performing like functions are called out in a numbered series. For example, bit cell is assigned callout 306 in FIG. 3 while in FIG. 4, bit cell is assigned callout 406.

In accordance with the illustrated embodiment, a bit cell 406 is connected to a first write bit line (WBL) 408 via a full pass gate (FPG) 402 and connected to a second write bit line bar (WBLB) 410 via FPG 404. A signal on the write control line (WCL) 412 and complementary write control line (WCLB) 414 can be asserted during a write phase and negated during a read phase. The signals on the WCL 414 and WCLB 412 can also be negated when the memory system is in an idle mode or retain mode. The operation of the memory cell 407 is similar to the operation the memory cells described above.

During a read phase, the read port 416 can read the value of the stored logic signal from the bit cell 406. Read port 416 can be layout separated from, i.e., external, to the memory cell 407 and co-located with other read ports that read values stored by other memory cells in an array (not shown) to facilitate a more compact memory array. The read port 416 can be configured and operate similar to the configuration described in FIG. 3. In the particular embodiment of FIG. 4, transistors 440 and 442 are interchanged relative to transistors 340 and 342 of FIG. 3 whereby transistor 440 is connected to ground and transistor 442 is connected to the read bit line 446.

During a read phase, NAND gate 460 can drive inverter 461 to assert transistor 440 via line 426, and if the bit cell 406 is storing a logic high value, both transistors 440 and 442 will be turned on thereby asserting a low signal on read line 446. In the illustrated configuration transistors 440 and 442 can generally provide the functionality of an AND gate.

Figure 5:
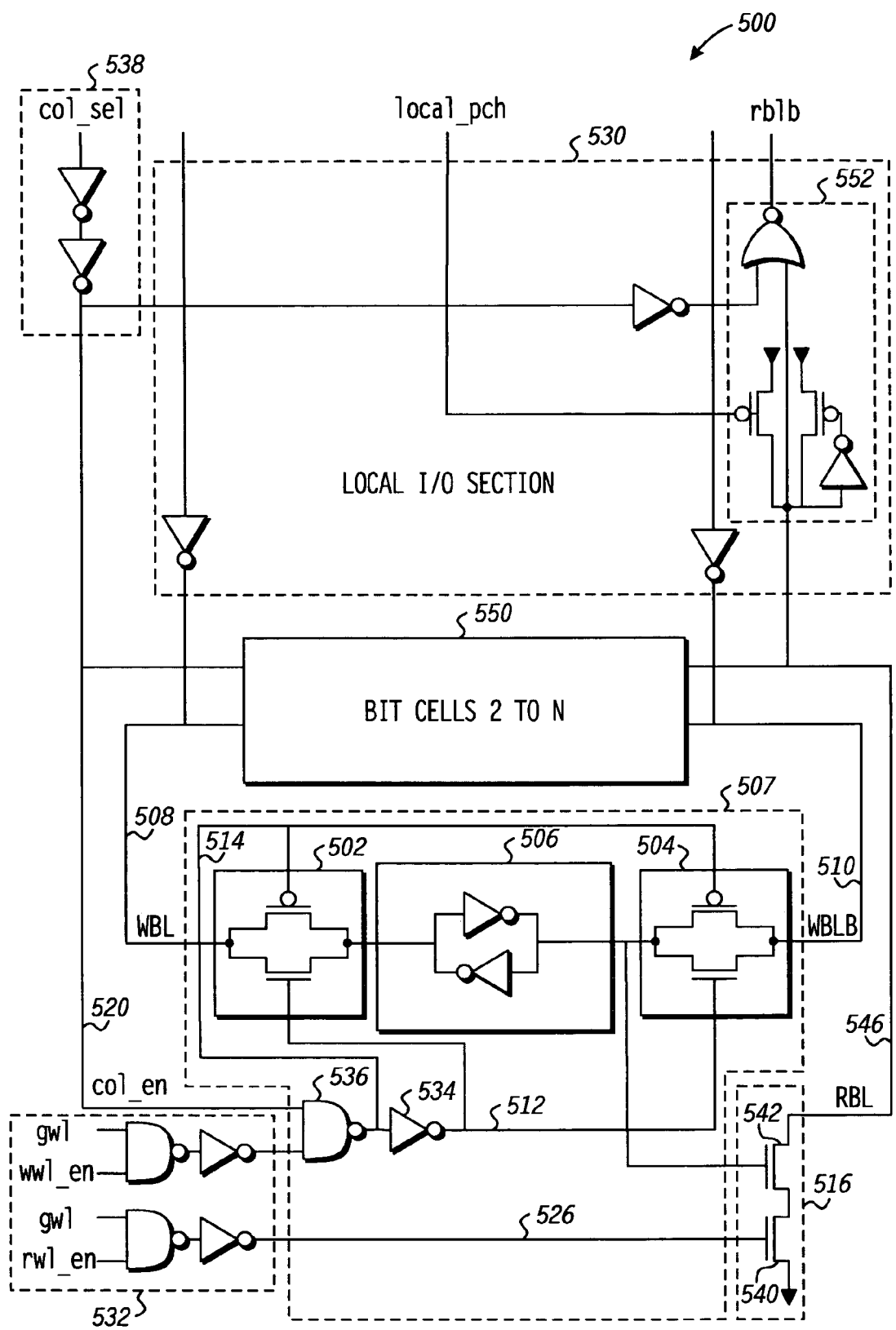
FIG. 5 is a block diagram of an exemplary memory cell array in accordance with an embodiment of the present disclosure.

Referring to FIG. 5, an exemplary embodiment of a larger portion of a memory system 500 is illustrated. In accordance with a particular embodiment, a memory array can have three basic subsystems: column select logic 538, local input/output section 530 read port 516, and memory cells such as memory cell 507 and many additional, often identical, memory cells represented by 550. In FIGS. 4 and 5, components performing like functions are called out utilizing a numbered series. For example, bit cell is assigned callout 406 in FIG. 4 while in FIG. 5, bit cell is assigned callout 506.

Memory cells in a memory array are typically arranged in a row/column format. In accordance with a particular embodiment, a local input/output section 530, column select logic 538, supporting control logic gates 532 and read port 516 may support many bit cells. In accordance with the illustrated embodiment, bit cell 506 is connected to write bit line (WBL) 508 via full pass gate (FPG) 502 and connected to write bit line bar (WBLB) 510 via FPG 504. The write bit lines 508 and 510 can also be connected to other bit cells in the array through their pass gates, which are part of the memory cells 550, not illustrated. Each of the numerous memory cells represented by bit cells 550 can contain a bit cell such as bit cell 506 and a read port such as read port 516. Write control line (WCL) 514 and complementary write control line (WCLB) 512 can deliver an asserted signal during a write phase and a negated signal during a read phase to the FPG 502 and 504 and all other pass gates in a memory system such as the pass gates that form memory cells 550.

In a read phase, the logic signal stored by the bit cell 506 can be determined utilizing a read port 516. The read port 516 of FIG. 5 can be configured and operate similar to the read port described in FIG. 4. As described with reference to the figures above providing separate read and write control signals and separate read and write bit lines allows for an efficient read and write process that provides superior write margin and cell current and can eliminate static noise margin as a concern.

The column select logic 538 and the column enable logic 532 can provide control logic to one or more memory cell within a specific area of the memory system. The column select logic 538 can also control output control logic 552. The column enable logic 532 can provide control logic to a single memory cell such as memory cell 507 or any number of memory cells as illustrated by memory cells 550. Local input/output section 532 can provide read and write control logic for each memory cell.

The additional control lines and logic gates required to operate full pass gates and discrete read ports require additional chip area. Therefore it is desirable to provide an efficient physical layout of the components disclosed above.

Figure 6:
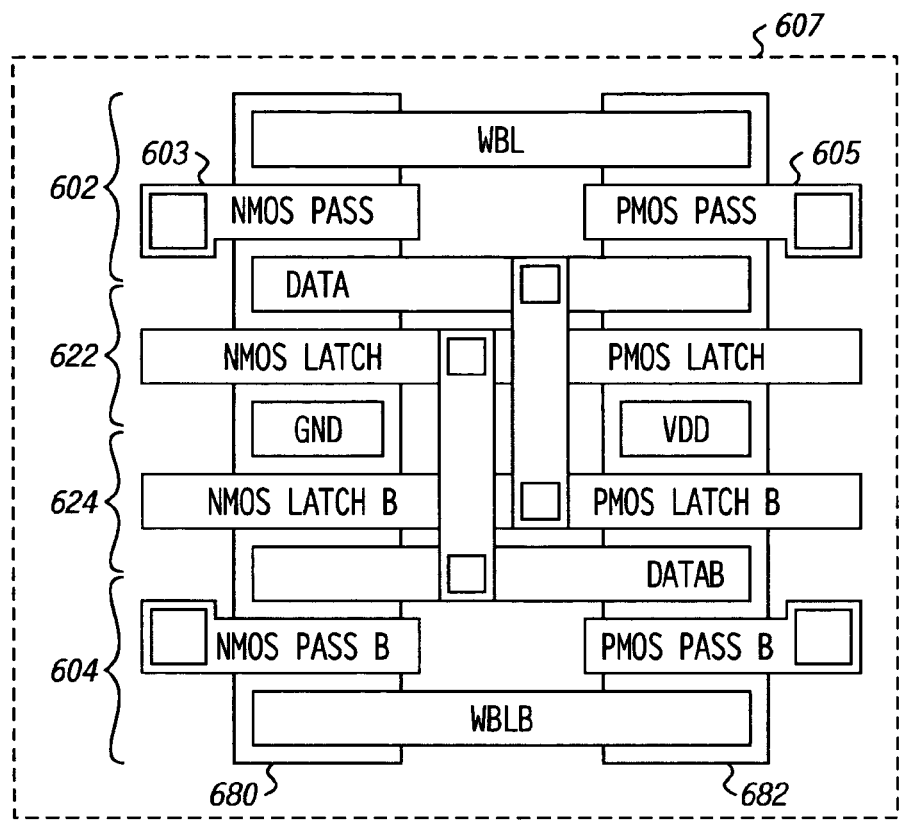
FIG. 6 is an exemplary physical layout of a portion of a memory system in accordance with the present disclosure.

FIG. 6 provides a physical layout of the memory cell configuration that could be utilized to implement at least a portion of the circuit described in FIG. 5. The additional transistors required to implement the additional control features of the present disclosure could prove troublesome because additional space for is often not available for circuit designers. A memory array may have a million memory cells, and thus a larger memory cell in memory design equates to a significant increase in required chip area. Without efficient implementation, a full pass gate memory cell design could be cost prohibitive.

The memory cell configuration represented by memory cell 207 in FIG. 2 can be efficiently laid out utilizing the configuration illustrated by the memory cell 607. One memory cell 607 has been illustrated that will support the full pass gate memory systems described above.

In accordance with the present disclosure, a memory cell can have two transistors configured as a full pass gate 602 (PMOS transistor having conductive gate 603 and NMOS transistor 605 having conductive gate), two transistors configured as inverter 622, two transistors configured as inverter 624, and two transistors configured as pass gate 604. Thus, the embodiment illustrated can have eight transistors tightly laid out in a rectangular "footprint" to create a compact memory cell.

As illustrated, the PMOS device 605 and an NMOS device having control gate 603 that forms the full pass gate 602 can be manufactured adjacent to one side of the memory cell 607) while full pass gate 604 can be manufactured adjacent to the other side of the memory cell 607.

In this configuration, only two strips of diffusion 680 and 682 need to be utilized. The first diffusion strip 680 can contain the active region for all NMOS devices and the second diffusion strip 682 can contain the active region for all PMOS devices. The ground pads and power pads can also be shared by the NMOS and PMOS inverter latch devices respectively at the center of the diffusion area. This compact and efficient design allows a full pass gate memory system to be implemented without the need for substantially larger chip areas.

Specifically illustrated in the layout of the FIG. 6 is a first pass gate 602, a second pass gate 604, and a latch formed from cross-coupled inverters 622 and 624. Full pass gate 602 includes an NMOS transistor, having a gate labeled NMOS PASS, and first and second current electrodes residing at diffusion strip 680. Full pass gate 602 further includes a second transistor having a control gate labeled PMOS PASS, and having first and second current electrodes residing at second diffusion strip 682. The latch formed at the layout of FIG. 6 comprises a first inverter 622, having a control gate labeled NMOS LATCH, a first current electrode at a location of diffusion strip 680 that is shared with full pass gate 602, and a second current electrode that is illustrated as being connected to a ground node. A second transistor of inverter 622 has a gate labeled PMOS LATCH, having a first current electrode residing at a shared location of diffusion strip 682, and a second current electrode at a location of diffusion strip 682 that is shared with full pass gate 602, that is illustrated as being connected to a VDD ground node. The latch further comprises a second inverter 624 that includes a first control gate labeled NMOS LATCH B, having a first current electrode that is at a location of the diffusion strip 680 that is shared with inverter 622, and a second current electrode at location of diffusion strip 680 that is shared with full pass gate 102. The inverter 624 further includes a transistor having a control gate labeled PMOS LATCH B, having a first current electrode residing at a location of diffusion strip 682 shared with a transistor of inverter 622, and a second current electrode at diffusion strip 682.

Figure 7:
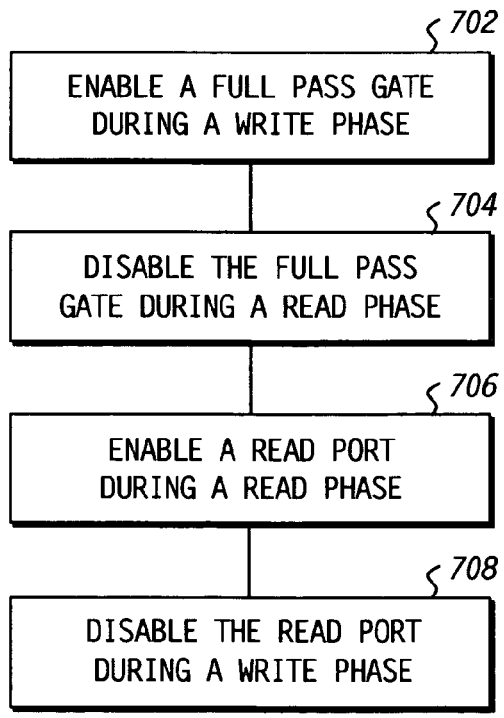
FIG. 7 is a flow diagram of an exemplary method for operating a memory cell in accordance with a specific embodiment of the present disclosure.

FIG. 7 is a flow diagram depicting a method for controlling the operation of a memory cell. As illustrated at block 702, a full pass gate is enabled during a write phase and the full pass gate can provide a low impedance path between a bit cell and a bit line such that a logic signal can be efficiently provided to and stored by the bit cell. A differential signal may be required to assert or turn the full pass gate on. As illustrated at block 704, the full pass gate can be disabled during a read phase such that the value stored by the bit cell is isolated from other circuits during a read phase. A differential signal provided by a control line and a complimentary control line may also be required to negate the pass gate or turn the pass gate off. During the read phase a read port can be enabled or activated as illustrated at block 704 such that the read port can determine the logic value stored by the bit cell and transmit a signal representative of the determined signal to other circuits. The read port can be disabled during the write phase as illustrated by block 708.

It will be appreciated that future devices have memory cells with similar design challenges or issues could be implemented in accordance with the teachings herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. An electronic device comprising:
   a full pass gate controllable by a write control line and a complimentary write control line, the full pass gate comprising:
      a first semiconductor transistor comprising a first electrode coupled to a first node of the bit cell, a second electrode coupled to a write bit line, and control electrode coupled to the write control line; and
      a second semiconductor transistor comprising a first electrode coupled to the first node of the bit cell, a second electrode coupled to the write bit line, and a control electrode coupled to the complementary write control line;
   a bit cell operably coupled to the full pass gate comprising a first node configured to receive a signal via the full pass gate and store the signal during a write phase to a write control signal; and
   a read control line separate from the write control line, configured to control a read phase wherein the signal is read from the bit cell during the read phase;
   and wherein a voltage drop across the first semiconductor transistor is less than one-half of voltage threshold of a transistor of the pass gate when the first semiconductor transistor is forward biased.

2. The device as in claim 1, wherein the first semiconductor transistor is a P-type transistor and the second semiconductor transistor is an N-type transistor.

3. The device as in claim 1, wherein a voltage drop across the second semiconductor transistor is substantially zero volts when the second semiconductor transistor is forward biased.

4. The device as in claim 1, further comprising an inverter having an input coupled to the write control line configured to generate a complementary write signal from a write signal at the write control line.

5. The device as in claim 1, further comprising a read port coupled between the bit cell and a read bit line, the read port having an input coupled to the first node of the bit cell to acquire a value of the stored bit and an output coupled to the read bit line.

6. The device as in claim 5, wherein the read port further comprises a first transistor coupled in a series configuration with a second transistor.

7. The device as in claim 1, further comprising a write line enable logic gate coupled to the write line and configured to enable and disable the write line.

8. The device as in claim 1, further comprising:
   a third semiconductor transistor comprising a first electrode coupled to a second node of the bit cell, a second electrode coupled to a complementary bit line, and a control electrode coupled to the write control line; and
   a fourth semiconductor transistor comprising a first electrode coupled to the second node of the bit cell, a second electrode coupled to the complementary bit line, and a control electrode configured to receive a complementary write control signal.

9. The device as in claim 8, wherein a voltage drop across the third semiconductor transistor is less than 0.6 volts when the third semiconductor transistor is forward biased and a voltage drop across the fourth semiconductor transistor is less than one-half a voltage threshold of a transistor of the pass gate when the fourth semiconductor transistor is forward biased.

10. A method comprising:
    controlling a full pass gate of a memory cell during a write phase, the full pass gate configured to provide approximately the same impedance between a write bit line and a bit cell during the write phase for a logic level high signal and a logic level low signal; and
    controlling a read port of the memory cell that is independent of the full pass gate during a read phase, the read port configured to relay a signal from the bit cell to a read bit line wherein and the read port provides high impedance isolation between the bit cell and a read bit line.

11. The method of claim 10, wherein controlling the read port further comprises asserting a read port control signal during a read phase and negating a read port control signal during a write phase.

12. The method of claim 10, wherein controlling the full pass gate further comprises controlling a first transistor with a write control signal and controlling a second transistor with a complementary write control signal.

13. The method of claim 10, wherein controlling the first pass gate further comprises activating a write signal wherein the write signal can be activated with a write enable signal.

14. The method of claim 10, wherein controlling the full pass gate further comprises controlling the full pass gate based on a column select signal.

15. An electronic device comprising:
    a first pass gate comprising:
       a first transistor comprising a first current electrode at a first location of a first diffusion strip of an integrated circuit, a second current electrode at a second location of the first diffusion strip, and a control gate;
       a second transistor comprising a first current electrode at a first location of a second diffusion strip of an integrated circuit, a second current electrode at a second location of the second diffusion strip, and a control gate, wherein the first current electrode is coupled to the first current electrode of the first transistor and the second current electrode is coupled to the second current electrode of the second transistor;

a second pass gate comprising:
   a third transistor comprising a first current electrode at a third location of a first diffusion strip of an integrated circuit, a second current electrode at a fourth location of the first diffusion strip, and a control gate;
   a fourth transistor comprising a first current electrode at a third location of a second diffusion strip of an integrated circuit, a second current electrode at a fourth location of the second diffusion strip, and a control gate, wherein the first current electrode is coupled to the first current electrode of the third transistor and the second current electrode is coupled to the second current electrode of the third transistor;

a latch comprising:
   a fifth transistor comprising first current electrode at the second location of the first diffusion strip, and a second electrode at a fifth location of the first diffusion strip;
   a sixth transistor comprising first current electrode at the fifth location of the first diffusion strip, and a second electrode at the third location of the first diffusion strip, wherein the fifth location is between the second location and the third location.

16. The electronic device of claim 15 wherein the second and third locations are between the first and second locations.

17. The electronic device of claim 15 wherein the latch further comprises a voltage reference node coupled to the 5th location of the diffusion strip.

* * * * *